United States Patent
James et al.

(10) Patent No.: US 6,249,827 B1
(45) Date of Patent: Jun. 19, 2001

(54) METHOD FOR TRANSFERRING DATA ASSOCIATED WITH A READ/WRITE COMMAND BETWEEN A PROCESSOR AND A READER CIRCUIT USING A PLURALITY OF CLOCK LINES

(75) Inventors: David V. James, Palo Alto, CA (US); Bruce Millar, Stittsville (CA); Cormac M. O'Connell; Peter B. Gillingham, both of Kanata (CA); Brent Keeth, Boise, ID (US)

(73) Assignee: Advanced Memory International, Inc., San Jose, CA (US)

( * ) Notice: Subject to any disclaimer, the term of this patent is extended or adjusted under 35 U.S.C. 154(b) by 0 days.

(21) Appl. No.: 08/987,328

(22) Filed: Dec. 9, 1997

Related U.S. Application Data (60) Provisional application No. 60/055,349, filed on Aug. 11, 1997, provisional application No. 60/057,092, filed on Aug. 27, 1997, provisional application No. 60/055,368, filed on Aug. 11, 1997, and provisional application No. 08/909,299, filed on Aug. 11, 1997.

(51) Int. Cl.[7] ............................. G06F 13/04; G06F 13/00; G06F 12/00; G11B 27/20
(52) U.S. Cl. ................................. 710/58; 711/167; 711/4; 711/168; 711/169; 711/157; 711/170; 711/217; 711/220; 710/60; 710/61; 710/33; 710/52
(58) Field of Search ..................................... 713/500, 600; 710/126, 129, 55, 57, 31, 14, 52, 4, 58; 711/167, 145, 141, 117, 157, 168, 169, 170, 217, 220; 712/11, 23, 35

(56) References Cited

U.S. PATENT DOCUMENTS

| | | | |
|---|---|---|---|
| 3,735,277 | * 5/1973 | Wanlass | 331/45 |
| 3,883,853 | * 5/1975 | O'Brien et al. | 340/172.5 |
| 4,366,538 | * 12/1982 | Johnson et al. | 364/200 |
| 4,371,928 | * 2/1983 | Barlow et al. | 364/200 |
| 4,503,494 | * 3/1985 | Hamilton et al. | 364/200 |
| 5,058,051 | * 10/1991 | Brooks | 364/900 |
| 5,394,541 | * 2/1995 | Chesley et al. | 395/550 |
| 5,428,804 | * 6/1995 | Davies | 395/800 |
| 5,696,730 | * 12/1997 | Slezak et al. | 365/227 |

* cited by examiner

Primary Examiner—Thomas Lee
Assistant Examiner—Katharina Schuster
(74) Attorney, Agent, or Firm—Fliesler, Dubb, Meyer & Lovejoy LLP (57) ABSTRACT

A memory circuit with glitch-less transfer of timing information. In one embodiment, the invention is a memory circuit including a controller, multiple loads, a command link communicatively coupling the controller and the loads and a data link. The data link includes multiple data clocks and communicatively couples the controller and the multiple loads. In another embodiment, the invention transfers data between a memory controller and a RAM by coupling the controller and the RAM using a data bus and multiple clock lines. The invention transfers a read/write command from the controller to the RAM and then transfers data associated with the read/write command, clocking the data using one of the clock lines.

26 Claims, 6 Drawing Sheets

METHOD FOR TRANSFERRING DATA ASSOCIATED WITH A READ/WRITE COMMAND BETWEEN A PROCESSOR AND A READER CIRCUIT USING A PLURALITY OF CLOCK LINES

This application claims priority from U.S. Provisional Patent Application No. 60/055,349, entitled, "SLDRAM Architecture," filed Aug. 11, 1997, naming as inventors Kevin Ryan et al., with Attorney Docket No. 017938-000900, and under an obligation of assignment to the Assignee of the instant invention. U.S. Provisional Patent Application No. 60/055,349 is incorporated herein by reference for all purposes.

This application also claims priority from U.S. Provisional Patent Application No. 60/057,092, entitled, "SLDRAM Architecture," filed Aug. 27, 1997, naming as inventors David B. Gustavson et al., and under an obligation of assignment to the Assignee of the instant invention. U.S. Provisional Patent Application No. 60/057,092 is incorporated herein by reference for all purposes.

This application also claims priority from U.S. Provisional Patent Application No. 60/055,368, entitled, "A High-Speed Memory Interface (SyncLink)," filed Aug. 11, 1997, naming as inventors David B. Gustavson et al., and under an obligation of assignment to the Assignee of the instant invention. U.S. Provisional Patent Application No. 60/055,368 is incorporated herein by reference for all purposes.

This application also claims priority from U.S. Patent Application No. 08/909,299, entitled, "Bifurcated Data and Command/Address Communication Bus Architecture for Random Access Memories Employing Synchronous Communication Protocols," filed Aug. 11, 1997, naming as inventors David B. Gustavson et al., and under an obligation of assignment to the Assignee of the instant invention. U.S. Patent Application No. 08/909,299 is incorporated herein by reference for all purposes.

BACKGROUND OF THE INVENTION

Figure 1:
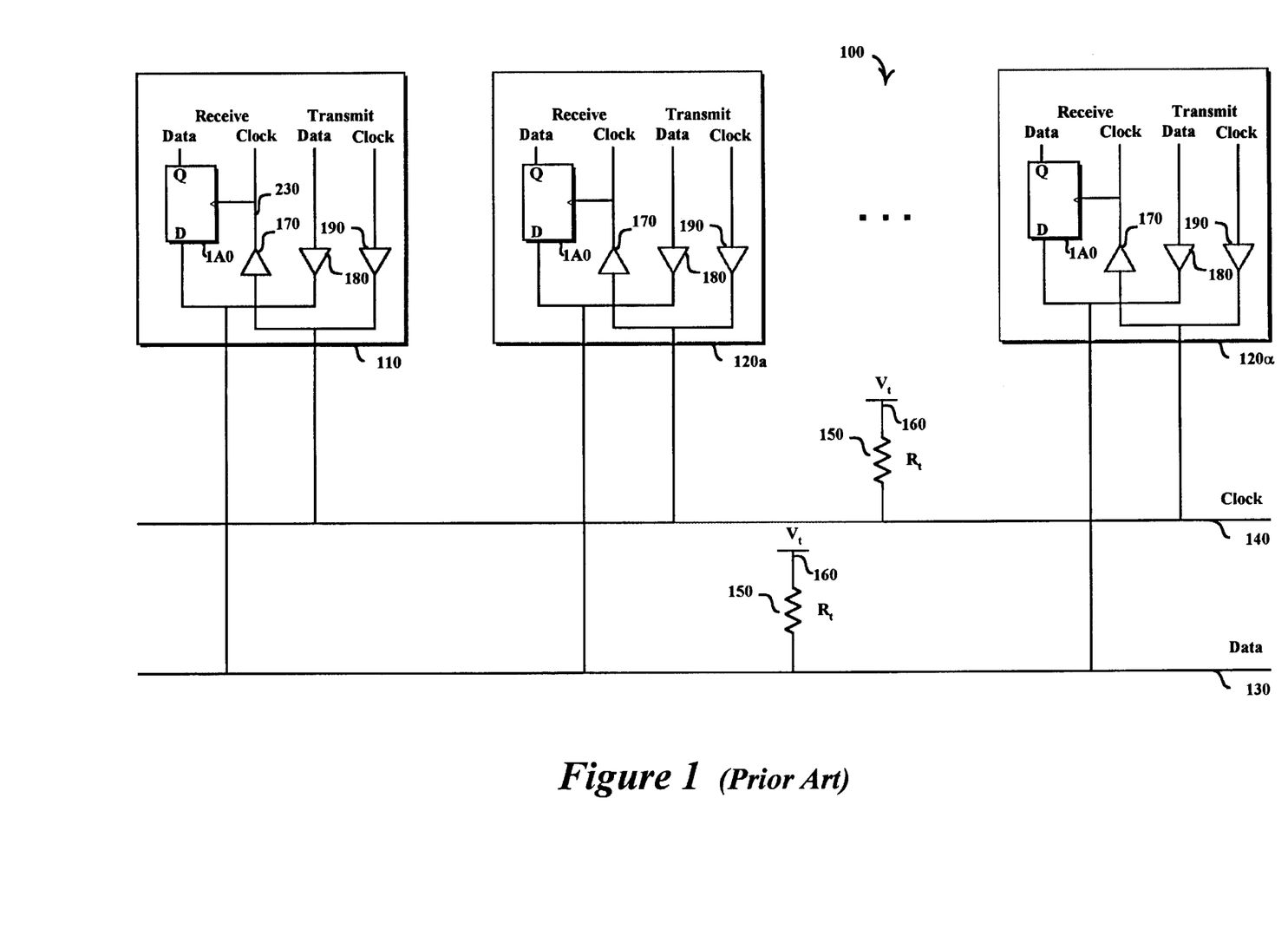

FIG. #_1 illustrates a memory circuit #_100 according to the prior art. The memory circuit #_100 includes a controller #_110 and DRAMs #_120a, #_120b, . . . , #_120α. The controller #_110 and the DRAMs #_120 are communicatively connected by means of a data bus #_130 and a clock bus #_140. A resistor $R_t$ #_150 ties each of the busses #_130 and #_140 to a voltage source #_160 at a threshold voltage $V_t$.

The circuit components #_110, #_120 each includes a D latch #_1A0, a receive clock buffer #_170 and transmit clock and data drivers #_180 and #_190. The data input of the D latch #_1A0 is coupled to the data bus #_130. The clock input of the D latch is coupled to the internal clock signal output from the receive clock buffer #_230.

Digital logic implements each of the drivers #_170, #_180 and #_190. The input-output function of the drivers is essentially a threshold function.

The data bus #_130 is a read/write bidirectional link. The circuit #_100 uses the bus #_130 to transfer write data from the controller #_110 to a DRAM #_120 and to transfer read data from a DRAM #_120 to the controller #_110.

The operation of the data bus #_130 occurs at a sufficiently high speed to require timing information with both read and write data. The data clock is used to latch the data.

Figure 2:
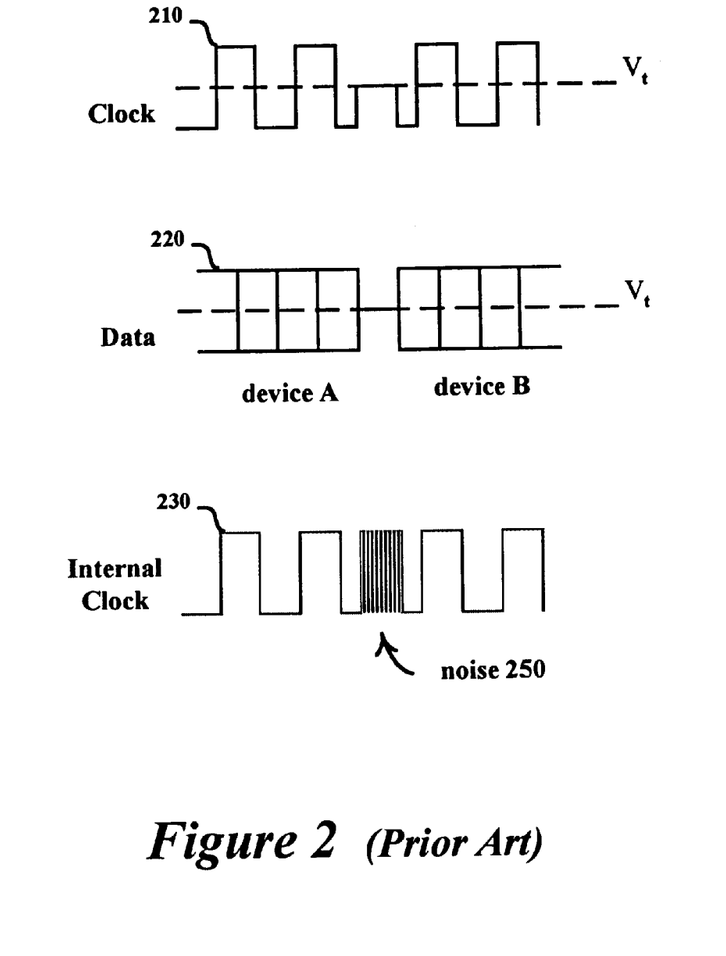

FIG. #_2 illustrates example clock and data signals #_210 and #_220, asserted on the clock and data busses #_140 and #_130, as well as an example internal clock signal #_230 as received in a receiving device. As FIG. #_2 illustrates, the data and clock busses #_130 and #_140 terminate to the midpoint threshold reference voltage $V_t$.

When the memory circuit #_100 passes control among the controller #_110 and the DRAMs #_120, the device A relinquishing control disables its data output and data clock drivers #_180 and #_190. The disabling allows the busses #_130, #_140 to return to a high impedance state. The device B taking control begins driving the data and clock busses #_130, #_140.

A problem occurs, however, in the device C (which may be the same as A) receiving the data: During the (brief) period of transition of control from one circuit #_100 component #_110, #_120 to another, the clock input #_210 through the buffer #_170 can be at a high impedance state at or near the threshold voltage $V_t$. The receiving device C may receive spurious clock edges #_250, corrupting the data received.

Figure 3:
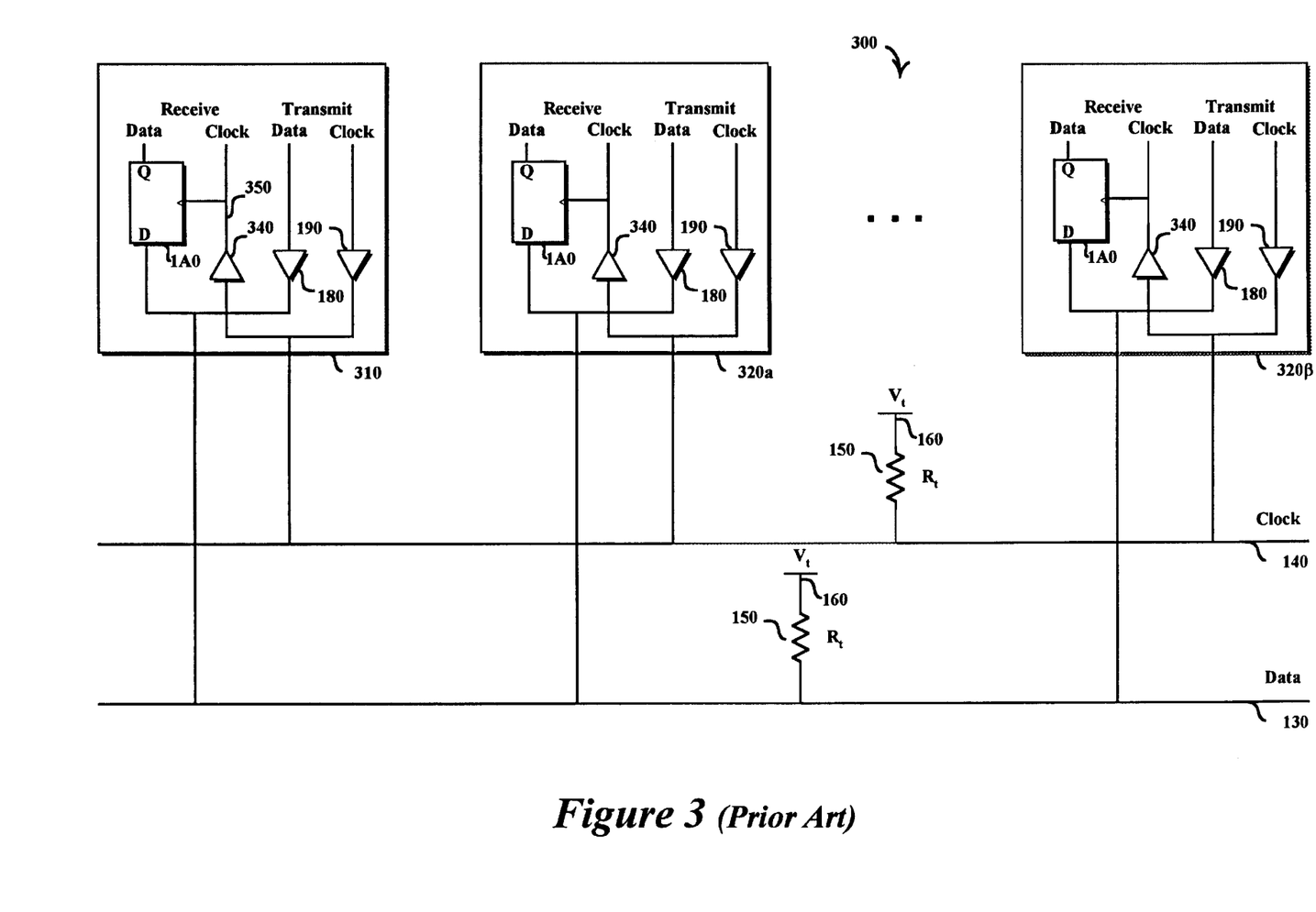

FIG. #_3 illustrates another memory circuit #_300 according to the prior art. The memory circuit #_300 includes a controller #_310 and DRAMs #_320a, #_320b, . . . , #_320β. The controller #_310 and the DRAMs #_320 are communicatively connected by the data bus #_130 and the clock bus #_140 tied by resistors $R_t$ #_150 to the voltage source #_160.

The data bus #_130 is a read/write bidirectional link. The circuit #_300 transfers write data from the controller #_310 to a DRAM #_320 on the bus #_130 and transfers read data from a DRAM #_320 to the controller #_310 on the bus #_130.

Each of the circuit #_300 components #_310, #_320 includes a D latch #_1A0, a receive clock buffer #_340 and transmit clock and data drivers #_180 and #_190. The data input of the D latch #_1A0 is coupled to the data bus #_130. The clock input of the D latch is coupled to the internal clock signal output from the receive clock buffer #_340.

Figure 6:
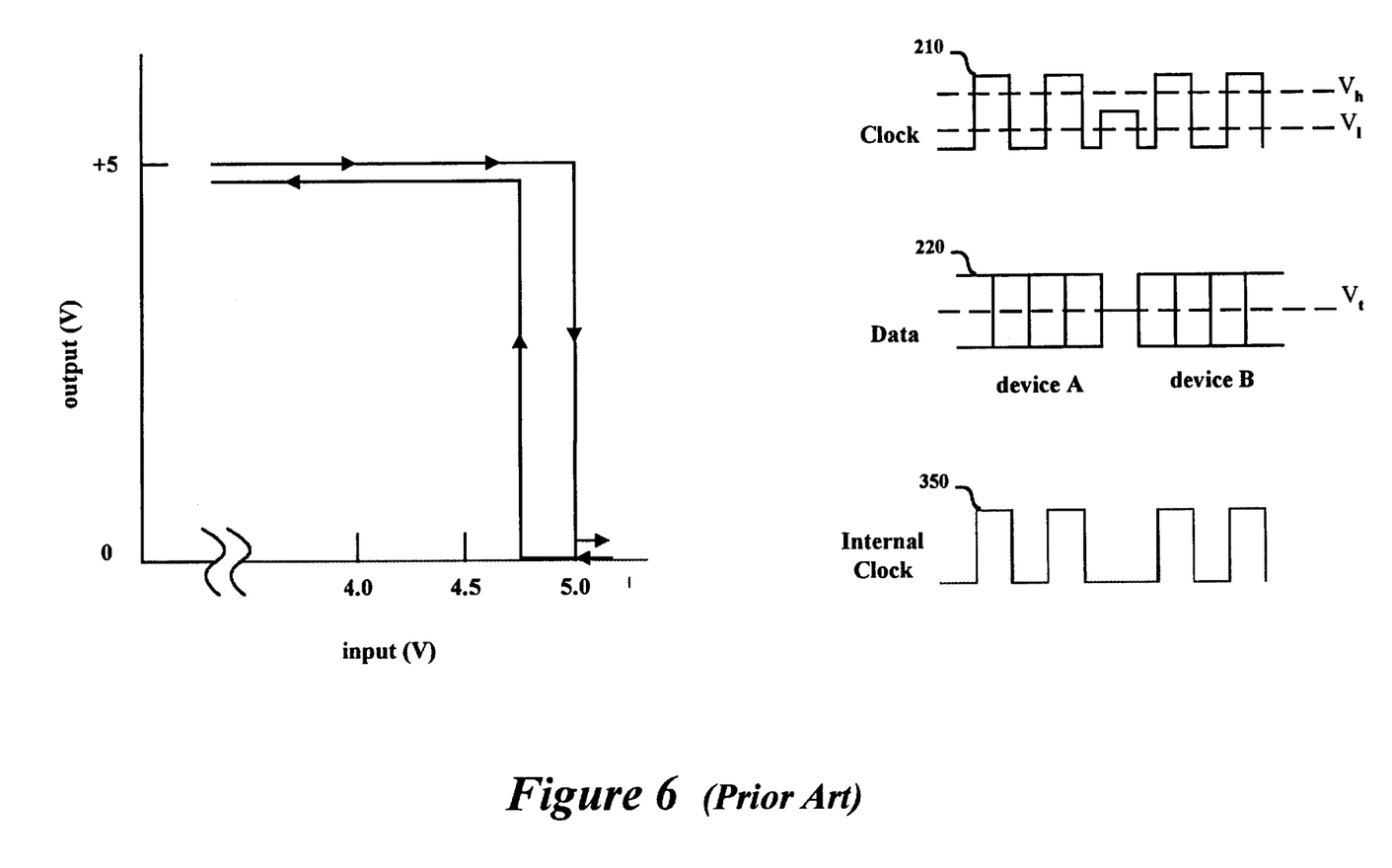

The clock input buffers #_340 have input-output functions with hysteresis. As the graph of FIG. #_6 shows, the output of a buffer #_340 depends on both the input voltage and the history of the input to the buffer.

When the memory circuit #_100 passes control among the controller #_110 and the DRAMs #_120, the device relinquishing control disables its data output drivers #_180 and data clock drivers #_190. The disabling allows the busses #_130, #_140 to return to a high impedance state. The device taking control begins driving the data and clock busses #_130, #_140.

FIG. #_6 illustrates the example data signal #_210 asserted on the data bus #_130 of the circuit #_300 and an example internal clock signal #_350 as received in a receiving device through a buffer #_340, given the clock signal #_210. As FIG. #_6 shows, the hysteretic buffer #_340 defeats the spurious clock edges #_250.

The buffers #_340, however, also defeat the predetermined matched delay of the data and clock paths using the D latch #_1A0 and the clock buffer #_170. The mismatch between clock and data also depends on the input slew rate.

Further, the hysteretic buffer #_340 has less input drive differential for equal amplitude signal. This reduces the speed potential of such a memory circuit.

According, there is a need for a memory circuit that, in operation, does not generate spurious clock edges as a clock signal approaches the high impedance state. One objective of the invention is such a memory circuit.

These and other objectives of the invention will be readily apparent to one of ordinary skill in the art on the reading of the background above and the description below.

SUMMARY OF THE INVENTION

Herein is disclosed a memory circuit with glitchless transfer of timing information. In one embodiment, the invention is a memory circuit including a controller, multiple loads, a command link communicatively coupling the controller and the loads and a data link. The data link includes multiple data clocks and communicatively couples the controller and the multiple loads.

In another embodiment, the invention transfers data between a memory controller and a RAM by coupling the controller and the RAM using a data bus and multiple clock lines. The invention transfers a read/write command from the controller to the RAM and then transfers data associated with the read/write command, clocking the data using one of the clock lines.

BRIEF DESCRIPTION OF THE DRAWINGS

FIG. #_1 illustrates a memory circuit according to the prior art;

FIG. #_2 illustrates sample clock, data and internal clock signals asserted on the clock and data busses of FIG. #_1;

FIG. #_3 illustrates a memory circuit according to the prior art;

FIG. #_4 is a timing diagram illustrating a series of Page Read and Page Write commands issued by the memory controller to the DRAMs FIG. #_5 illustrates a memory circuit according to the invention; an FIG. #_6 illustrates sample clock, data and internal clock signals asserted on the clock and data busses of FIG. #_3.

DESCRIPTION OF THE PREFERRED EMBODIMENT

Figure 5:
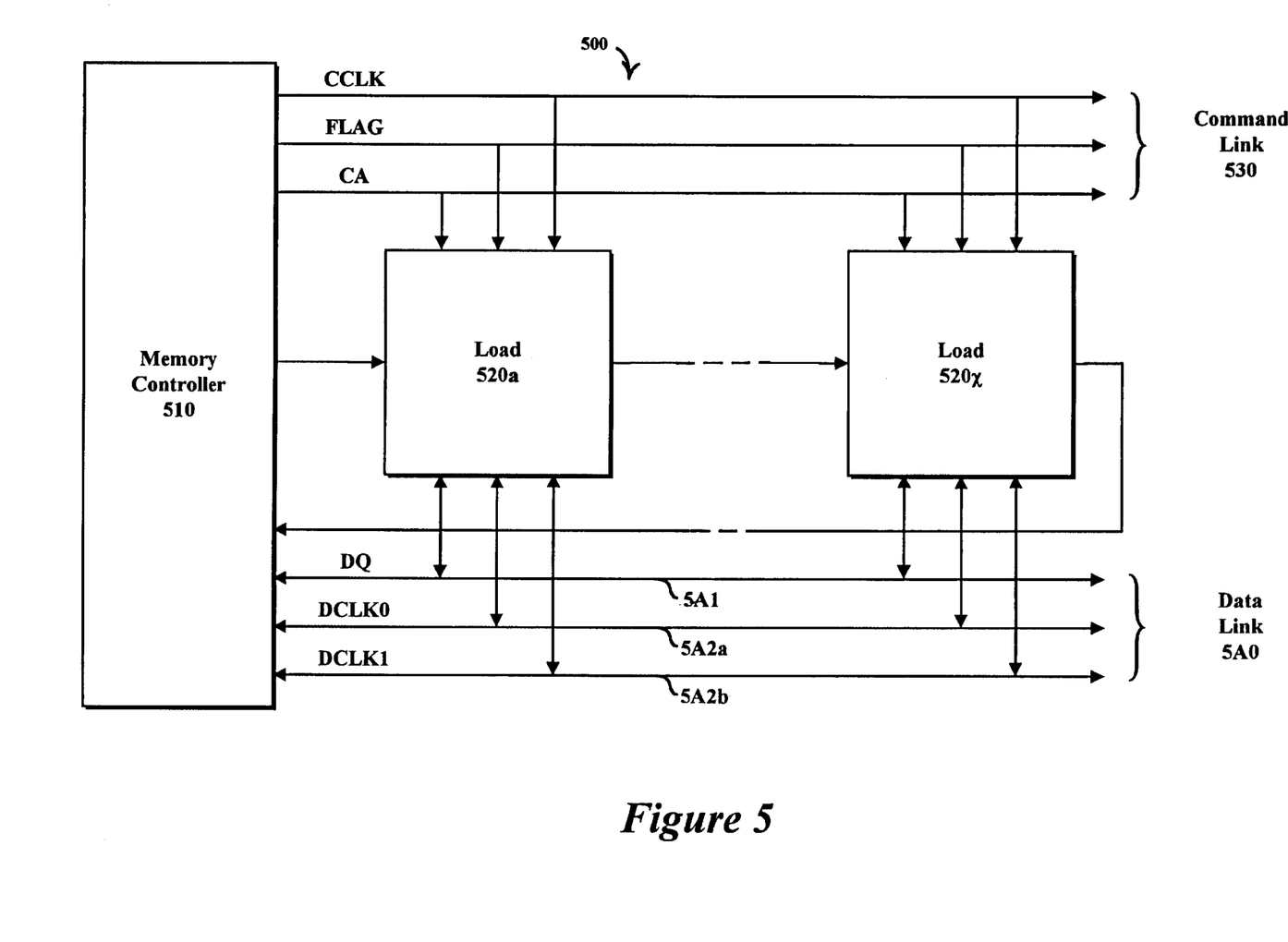

FIG. #_5 illustrates a memory circuit #_500 according to one embodiment of the invention. The circuit #_500 includes a controller #_510 and loads #_520. A load #_520 can be a single DRAM device, a buffered module comprising many DRAMs or a similar load.

The controller #_510 and the loads #_520 are communicatively coupled by means of a command link #_530. The unidirectional command link #_530 sends command, address and control information to the loads #_520.

The controller #_510 and the loads #_520 are also communicatively coupled by means of a data link #_5A0. The bidirectional data link #_5A0 conveys read and write data between the controller #_510 and the loads #_520. The data link #_5A0 includes a data bus #_5A1, a first data clock (and its logical inverse) #_5A2a, as well as a second data clock (and its logical inverse) #_5A2b. A data clock is single-ended or, as described here, differential.

A differential clock #_5A2 accompanies read and write data packets. (In one embodiment, such clocked packets have a minimum burst length of 4 clock phases ("4N")). The two sets of DCLKs #_5A2 allow one circuit component #_510, #_520 to pass control of the data link #_5A0 to another component #_510, #_520 with minimum gap.

When the circuit #_500 passes control of the data link #_5A0 from one device #_510, #_520 to another, the data link #_5A0 remains at a midpoint voltage level for nominally 2N. Indeterminate logic levels and multiple transitions may appear at the input buffers in the components #_510, #_520.

This is acceptable for the data lines DQ #_5A1 themselves but not for the data clocks #_5A2 used to strobe data.

To address this problem, each data clock #_5A2 has a 00010 preamble before the clock transition associated with the first bit of the corresponding data. The device #_510, #_520 receiving the data enables its DCLK input buffer anytime during the first 000 period. The dummy 10 transition in the preamble removes pulse width-dependent skew from the DCLK signal #_5A2. The receiving device #_510, #_520 ignores the first rising and falling edges of the DCLK #_5A2 and begins clocking data on the second rising edge.

Providing two data clocks accommodates gapless 4N write bursts to different DRAMs and 4N read bursts from different DRAMs.

The controller #_510 indicates in each command packet which DCLK #_5A2 is to be used.

The controller #_510 transmits CCLK edges coincident with edges of CA and FLAG data. DCLK edges originating from the controller #_510 coincide with DQ data. The DRAMs #_520 add fractional delay to incoming CCLK and DCLKs #_5A2 to sample commands and write data at the optimum time. The controller #_510 programs the DRAMs #_520 to add fractional delay to the DCLKs #_5A2, allowing the controller read data input registers to directly strobe in read data using the received DCLK #_5A2 without the need for any internal delay adjustments.

Figure 4:
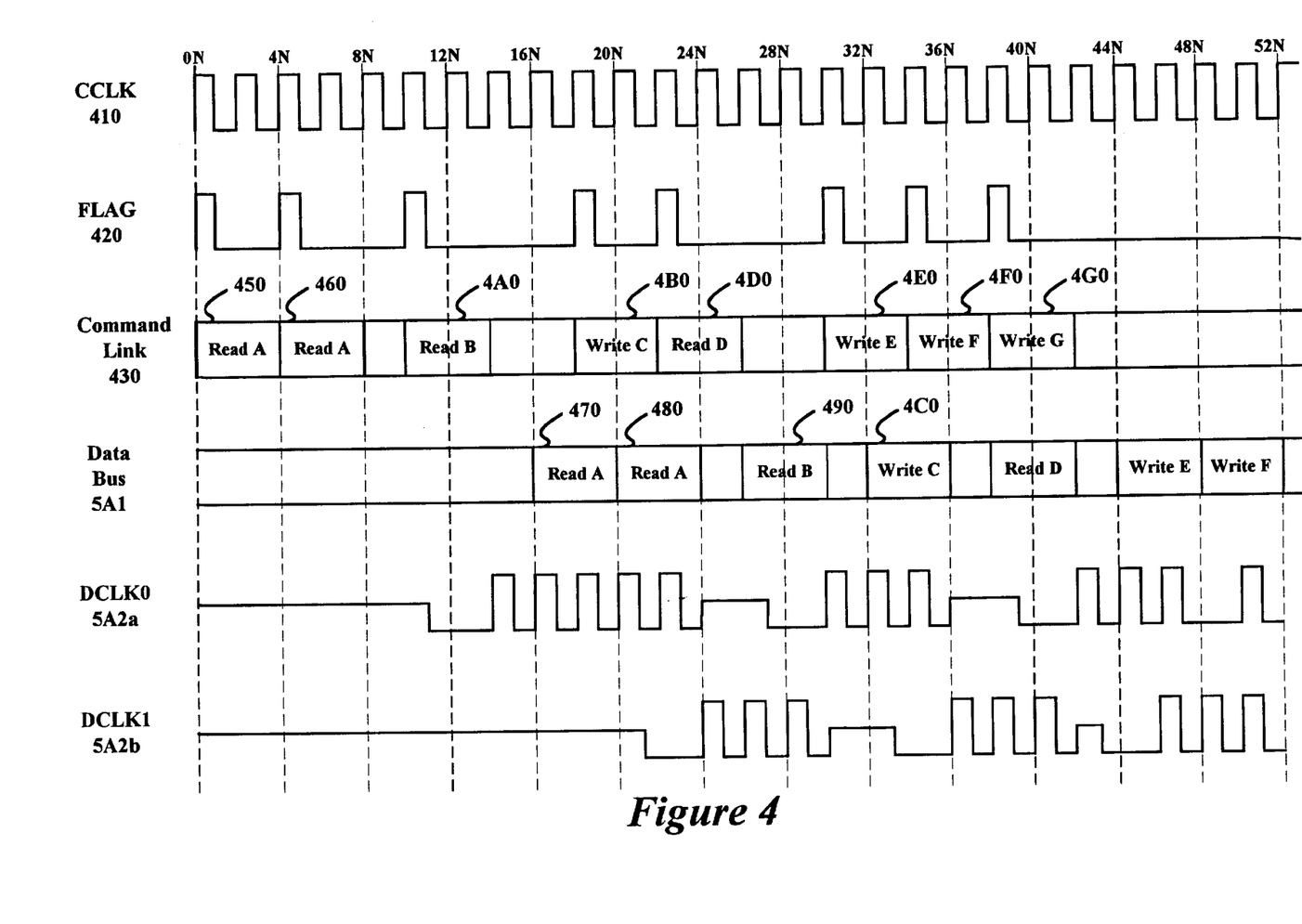

FIG. #_4 is a timing diagram illustrating a series of Page-Read and Page-Write commands issued by the memory controller #_510 to the DRAMs #_520. (For purposes of illustration, all burst lengths are 4N, although the controller #_510 can dynamically mix 4N and 8N bursts.)

The read access time to an open bank, the Page-Read Latency, is shown here as 12N. The first two commands Read A #_450 and #_460 are Page Reads to different banks in the DRAM #_520a. The read data Read A #_470 appears on the data bus #_5A1 along with DCLKO #_5A2a. The data clock DCLKO #_5A2a provides the memory controller #_510 the necessary edges to strobe in the read data.

Since the first two Page-Read commands #_450, #_460 are for the same DRAM #_520a, no gap is necessary between the two 4N data bursts #_470, #_480. The DRAM #_520a itself continuously drives DCLKO #_5A2a without any glitch. However, a 2N gap precedes the data burst #_490 for the following Page Read #_4A0 to DRAM #_520b to allow for settling of the data link #_5A0 and for timing uncertainty between the DRAMs #_520a and #_520b.

The circuit #_500 inserts a 2N gap any time control of the data link #_5A0 passes from one device #_510, #_520 to another, as in reads to different DRAMs #_520 or read-to-write and write-to-read transitions between the DRAMs #_520 and the memory controller #_510. The controller #_510 creates the 2N gap between data by inserting a 2N gap between commands. The DCLK1 clock #_5A2b accompanies data for the Read B command #_4A0, allowing the DRAM #_520b to begin driving the DCLK lines #_5A2b well in advance of the actual data burst #_490.

The next command is a write command #_4B0 using DCLKO #_5A2a to strobe write data #_4C0 into the DRAM #_520c. The Page-Write Latency of the DRAM is programmed to equal the Page-Read Latency less 2N. To create a 2N gap between the Read B data #_490 and Write C data #_4C0 on the data link #_5A0, the controller #_510 delays the Write C command #_4B0 4N after the Read B command #_4A0.

Programming write latency in this manner creates an open 4N command slot on the Command Link #_530, which slot may be used for non-data commands such as row open or close, register write or refresh. These non-data commands do not affect the utilization of the data link #_5A0.

The following read command #_4D0 to DRAM #_520d does not use delay to achieve the 2N gap on the data link #_5A0.

The final burst of three consecutive write commands #_4E0, #_4F0, #_4G0 shows that a 2N gap between data bursts is not required when writing to different DRAM devices #_520. Different DCLKs #_5A2 are used so that each DRAM #_520 can identify the start of its write data burst. Since all write data originates from the memory controller #_510, no glitches on the DCLKs #_5A2 occur.

Such embodiments as are described herein are by way of example and not limitation. Modifications to the invention as described will be readily apparent to one of ordinary skill in the art. For example, the number of data clocks can be more than two (and, correspondingly, the FLAG signal more than one bit.)

Indeed, the invention described herein is not limited to DRAMs or even to memories. This invention applies to any shared synchronous bus in which a clock accompanies data, as in source synchronous clocking. Accordingly, the scope of the invention is to be determined by the metes and bounds of the claims which immediately follow:

What is claimed is:

1. A method for transferring data between a processor circuit for processing said data and a reader circuit for reading said data, said method comprising the steps of:
    coupling the processor circuit and the reader circuit of data by means of a data bus and a plurality of clock lines:
    transferring a read/write command between said processor and said reader circuit; and
    then transferring data associated with said read/write command, clocking said data by means of one of the plurality of clock lines,
    wherein before said step of transferring data is performed, the following steps are performed:
        permitting said one clock line to float; and
        then driving a preamble on said one clock line.

2. The method of claim 1 wherein in said step of driving the preamble, the preamble comprises a multi-bit, constant logic value.

3. The method of claim 1 wherein in said step of driving the preamble, the preamble comprises a multi-bit constant logic value followed by a dummy transition.

4. The method of claim 1, wherein the reader circuit comprises a RAM circuit, the RAM circuit forming one element of a module comprising multiple DRAMs.

5. The method of claim 1, wherein said read/write command comprises an indication of which of said plurality of clock lines is to be used during transfer of the associated data.

6. A method of transferring data between a processor circuit for processing said data and a reader circuit for reading said data, said method comprising the steps of:
    coupling the processor circuit and the reader circuit of data by means of a data bus and a plurality of clock lines;
    transferring a read/write command between said processor and said reader circuit; and
    then transferring data associated with said read write command, clocking said data by means of one of said plurality of clock lines,
    wherein before said step of transferring data is performed, control of said data bus is switched between said processor and said reader circuit by a method comprising the steps of:
        firstly driving a clock signal on a second of said plurality of clock lines;
        then ceasing to drive said second clock line;
        driving a preamble on said one clock line; and
        then secondly driving a clock signal on said one clock line.

7. The method of claim 6 wherein said steps of firstly driving and driving a preamble overlap.

8. The method of claim 6 wherein said steps of ceasing to drive and driving a preamble overlap.

9. The method of claim 6 wherein in said step of driving a preamble, the preamble comprises a multi-bit, constant logic value.

10. The method of claim 6 wherein in said step of driving a preamble, the preamble comprises a multi-bit, constant logic value followed by a dummy transition on said one clock line.

11. The method of claim 6, wherein the reader circuit comprises a RAM circuit, the RAM circuit forming one element of a module comprising multiple DRAMs.

12. A method for transferring data between a processor circuit for processing said data and one of a plurality of reader circuits for reading said data, the method comprising the steps of:
    coupling the processor circuit and the plurality of reader circuits by means of a data bus and a plurality of clock lines;
    transferring a read/write command between said processor and said plurality of reader circuits;
    then transferring data associated with said read/write command, clocking said data by means of one of said plurality of clock lines,
    wherein before said step of transferring data is performed, control of said data bus is switched from one of said reader and said processor circuits to another, wherein said step of switching control comprises:
        firstly driving a clock signal on a second of said plurality of clock lines;
        then ceasing to drive said second clock line;
        then driving a preamble on said one clock line; and
        then secondly driving a clock signal on said one clock line.

13. The method of claim 12 wherein said steps of firstly driving and driving a preamble overlap.

14. The method of claim 12 wherein said steps of ceasing to drive and driving a preamble overlap.

15. The method of claim 12 wherein in said step of driving a preamble, the preamble comprises a multi-bit, constant logic value.

16. The method of claim 12 wherein in said step of driving a preamble, the preamble comprises a multi-bit, constant logic value followed by a dummy transition on said one clock line.

17. The method of claim 12 wherein during said step of transferring data, clocking said data is performed for a burst length of four clock phases by means of said one clock line.

18. The method of claim 12 wherein before said step of transferring data is performed the following steps are performed
    coupling said processor and a second reader circuit by means of said data bus and said plurality of clock lines; and transferring a second read/write command from said processor to said second reader circuit; and wherein said method further comprises the step of then transferring second data associated with said second read/write command, clocking said second data by means of a second of said plurality of clock lines, wherein said second data immediately follows said first data on said data bus.

19. The method of claim 18 wherein said steps of transferring a read/write command and transferring a second read/write command each comprise transferring a write command.

20. The method of claim 18 wherein said steps of transferring a read/write command and transferring a second read/write command each comprise transferring a read command.

21. The method of claim 18, further comprising driving a preamble on said one clock line, overlapping the last bit of said clocking and the first bit of said preamble.

22. The method of claim 18, wherein said step of transferring a read/write command comprises:

transferring a first write command between said processor and said reader circuit;

transferring a second write command between said processor and said second reader circuit less than two clock phases after transferring said first write command; and then transferring the second data associated with said second write command less than two clock phases after transferring said data associated with said first write command.

23. The method of claim 18, wherein the plurality of reader circuits each comprise a RAM circuit, the RAM circuits forming elements of a module comprising multiple DRAMs.

24. The method of claim 18, wherein said read/write command includes an indication of which of said plurality of clock lines is to be used during transfer of the associated data, and wherein said second read/write command includes an indication of which of said plurality of clock lines is to be used during transfer of the second data.

25. A method for commanding a data circuit, said method comprising:

coupling a controller circuit and a data circuit by means of a command bus;

transferring a read-write-read command sequence from said controller circuit, thereby creating a non-data slot on said command bus; and transferring-a non-data command between said controller and data circuits in said non-data slot.

26. The method of claim 25, wherein during said step of transferring a read-write-read command sequence from said controller circuit, each read/write transition creates the non-data slot as a two-phase non-data slot on said command bus, and wherein in said step of transferring said non-data command said non-data slot is a four-phase non-data slot.

* * * * *